US007911116B2

(12) United States Patent
Aikawa et al.

(10) Patent No.: US 7,911,116 B2
(45) Date of Patent: Mar. 22, 2011

(54) SURFACE ACOUSTIC WAVE DEVICE AND METHOD OF FABRICATING THE SAME

(75) Inventors: Shunichi Aikawa, Yokohama (JP); Masayuki Kitajima, Yokohama (JP); Keiji Tsuda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 164 days.

(21) Appl. No.: 12/410,131

(22) Filed: Mar. 24, 2009

(65) Prior Publication Data

US 2009/0236934 A1    Sep. 24, 2009

(30) Foreign Application Priority Data

Mar. 24, 2008 (JP) ................................. 2008-074885

(51) Int. Cl.
*H03H 9/25* (2006.01)
*H01L 41/22* (2006.01)

(52) U.S. Cl. ................. 310/340; 310/313 R; 310/313 D; 29/25.35

(58) Field of Classification Search .............. 310/313 B, 310/313 D, 313 R, 340; 29/25.35
See application file for complete search history.

(56) References Cited

U.S. PATENT DOCUMENTS

| 6,557,225 B2 * | 5/2003 | Takata et al. ................. 29/25.35 |
| 7,629,729 B2 * | 12/2009 | Inoue et al. ................... 310/348 |
| 2002/0024271 A1 | 2/2002 | Hori et al. |
| 2003/0038562 A1 * | 2/2003 | Ikada et al. ............... 310/313 B |
| 2004/0174090 A1 | 9/2004 | Koshido |

FOREIGN PATENT DOCUMENTS

| JP | 11-150441 A | 6/1999 |
| JP | 2002-100951 A | 4/2002 |
| JP | 3405329 B2 | 3/2003 |
| JP | 2004-129224 A | 4/2004 |

* cited by examiner

*Primary Examiner* — Thomas M Dougherty
(74) *Attorney, Agent, or Firm* — Arent Fox LLP

(57) ABSTRACT

A surface acoustic wave device includes a piezoelectric substrate, an interdigital transducer (IDT) formed on the piezoelectric substrate, an interconnection electrode that is provided on the piezoelectric substrate and is connected to the IDT, the IDT being made of a metal identical to that of the IDT, an inorganic insulation layer that is provided on the piezoelectric substrate so that at least the interconnection electrode is exposed, an insulative resin layer that is located on an interface between the inorganic insulation layer and a portion of the interconnection electrode exposed from the inorganic insulation layer and is formed so as to cover a side surface of the interconnection electrode, and a metal layer that is provided on the interconnection electrode and the insulative resin layer.

12 Claims, 6 Drawing Sheets

SURFACE ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2008-074885, filed on Mar. 24, 2008, the entire contents of which are incorporated herein by reference.

FIELD

The present invention generally relates to surface acoustic wave devices, and more particularly, to a surface acoustic wave device having an interdigital transducer (IDT) composed of comb electrodes.

BACKGROUND

Recently, mobile communications devices such as cellular phones have been progressively spread due to the development of information-oriented society. Acoustic wave devices are used in the mobile communications devices as duplexers, transmission bandpass filters or reception bandpass filters, and are required to be downsized, weight-lightened and more reliable.

A surface acoustic wave device composed of an IDT and reflectors formed on a piezoelectric substrate is a typical example of the acoustic wave devices. An acoustic wave is excited by an electric signal applied to the IDT and a resultant electric signal of a frequency in the pass band is output.

Now, a SAW device described in Japanese Patent No. 3405329 (Document 1) is described below. Document 1 describes a technique of providing a reaction restraining film and a metal layer on an interconnection electrode.

FIG. 1A is a plan view of a SAW device 100. Reflectors 4 and IDTs 6 made of a metal such as aluminum are formed on a piezoelectric substrate 2 made of lithium niobate ($LiNbO_3$) or lithium tantalate ($LiTaO_3$). Further, there are provided interconnections 10 connected to the IDTs 6 and external connection terminals 8 connected to the interconnections 10.

FIG. 1B is a cross-sectional view taken along a line A-A depicted in FIG. 1A. Referring to FIG. 1B, each of the interconnections 10 is composed of an interconnection electrode 12, a first metal layer 14, a second metal layer 16, a third metal layer 18, and an inorganic insulation layer 20. The interconnection electrode 12 is formed on the piezoelectric substrate 2 and may be made of aluminum. The first metal layer 14 is provided on the interconnection electrode 12 and may be made of titanium. The second metal layer 16 is provided on the first metal layer 14 and may be made of palladium. The inorganic insulation layer 20 is interposed between the interconnection electrode 12 and the first metal layer 14.

FIG. 2A illustrates a variation of the SAW device illustrated in FIG. 1B. The inorganic insulation layer 20 is provided so as to cover the side surfaces of the interconnection electrode 12. Document 1 describes that reaction of the interconnection electrode 12 with the metal layers can be restrained, so that the junctions between the interconnection electrode 12 and the metal layers and the junctions between the interconnections 10 and the external connection terminals 8 can be strengthened.

However, in the structure illustrated in FIG. 1B, since side surfaces 12a of the interconnection electrode 12 are exposed, the interconnections 10 do not have good moisture resistance.

Moisture that enters into the interconnection electrode 12 corrodes it and degrades the reliability of the SAW device.

FIG. 2B is an enlarged view of one of the side surfaces 12a of the interconnection electrode 12 and its vicinity. Referring to FIG. 2B, there is a great step between the piezoelectric substrate 2 and the interconnection electrode 12, and the thickness of the inorganic insulation layer 20 may be reduced unwillingly (backward tapered). In this case, the interconnection electrode does not have good moisture resistance, and therefore, the reliability of the SAW device may be degraded.

SUMMARY

According to an aspect of the present invention, there is provided a surface acoustic wave device includes a piezoelectric substrate, an interdigital transducer (IDT) formed on the piezoelectric substrate, an interconnection electrode that is provided on the piezoelectric substrate and is connected to the IDT, the IDT being made of a metal identical to that of the IDT, an inorganic insulation layer that is provided on the piezoelectric substrate so that at least the interconnection electrode is exposed, an insulative resin layer that is located on an interface between the inorganic insulation layer and a portion of the interconnection electrode exposed from the inorganic insulation layer and is formed so as to cover a side surface of the interconnection electrode, and a metal layer that is provided on the interconnection electrode and the insulative resin layer.

According to another aspect of the present invention, there is provided a method of fabricating a surface acoustic wave device comprising: forming an interdigital transducer (IDT) and an interconnection electrode connected thereto on a piezoelectric substrate, the IDT and the interconnection electrode being made of an identical metal; forming an inorganic insulation layer on the piezoelectric substrate so that at least the interconnection electrode is exposed; forming an insulative resin layer on an interface between the inorganic insulation layer and a part of the interconnection electrode exposed from the inorganic insulation layer; and forming a metal layer on the interconnection electrode and the insulative resin layer.

The object and advantages of the invention will be realized and attained by means of the elements and combinations particularly pointed out in the claims.

It is to be understood that both the foregoing general description and the following detailed description are exemplary and explanatory and are not restrictive of the inventions as claimed.

DESCRIPTION OF EMBODIMENTS

A description is now given of embodiments of the present invention with reference to the accompanying drawings.

First Embodiment

Figure 1A:
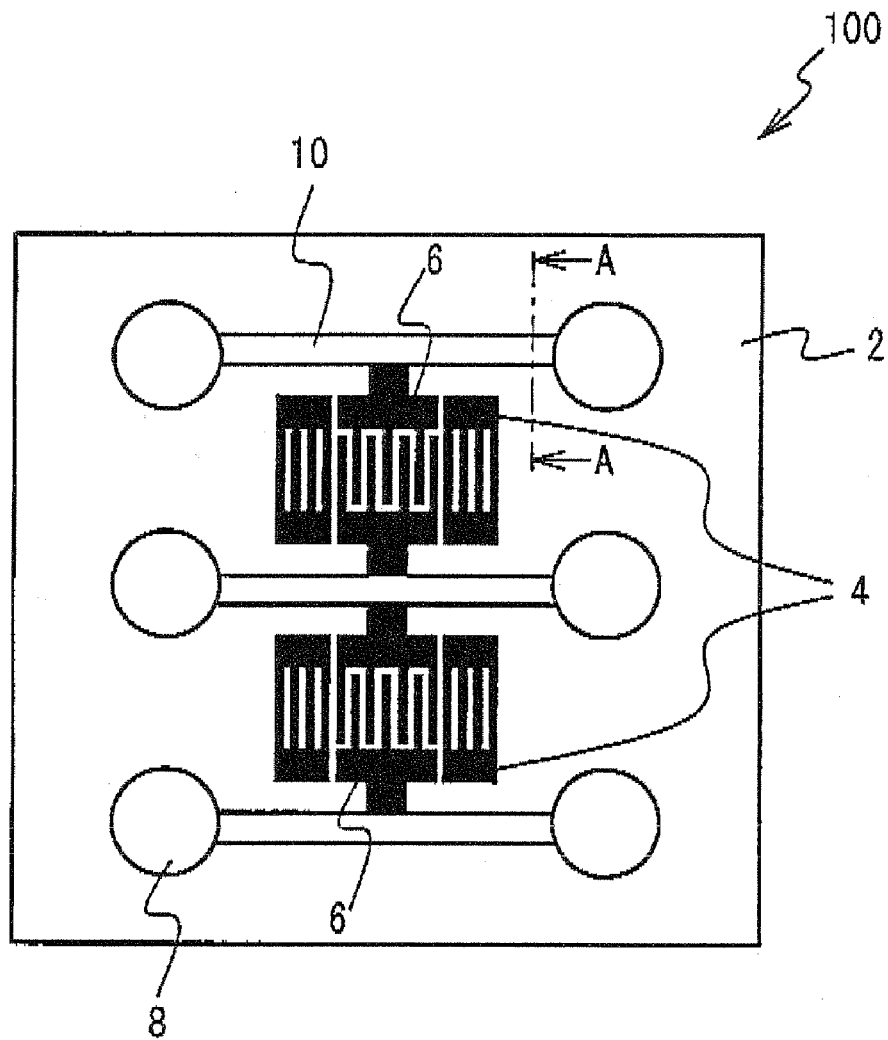
FIG. 1A is a plan view of a surface acoustic wave device related to the present invention.
Figure 1B:
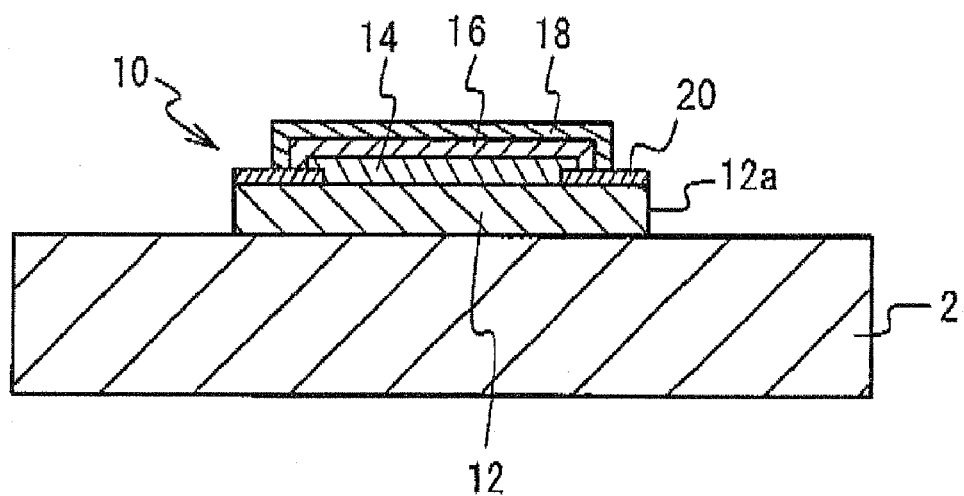
FIG. 1B is a cross-sectional view taken along a line A-A depicted in FIG. 1A.
Figure 2A:
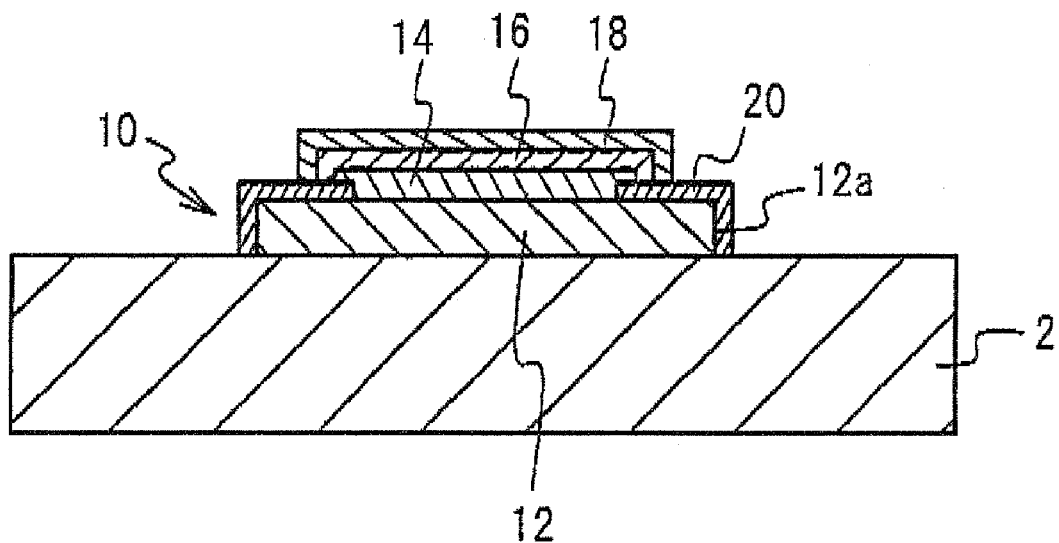
FIG. 2A is a cross-sectional view of a variation of the surface acoustic wave device depicted in FIG. 1B.
Figure 2B:
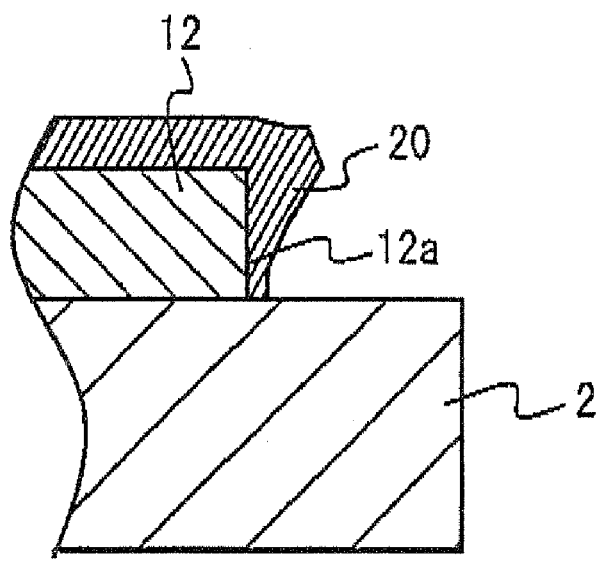
FIG. 2B is an enlarged view of one of the side surfaces 12a of the interconnection electrode 12 and its vicinity.
Figure 3A:
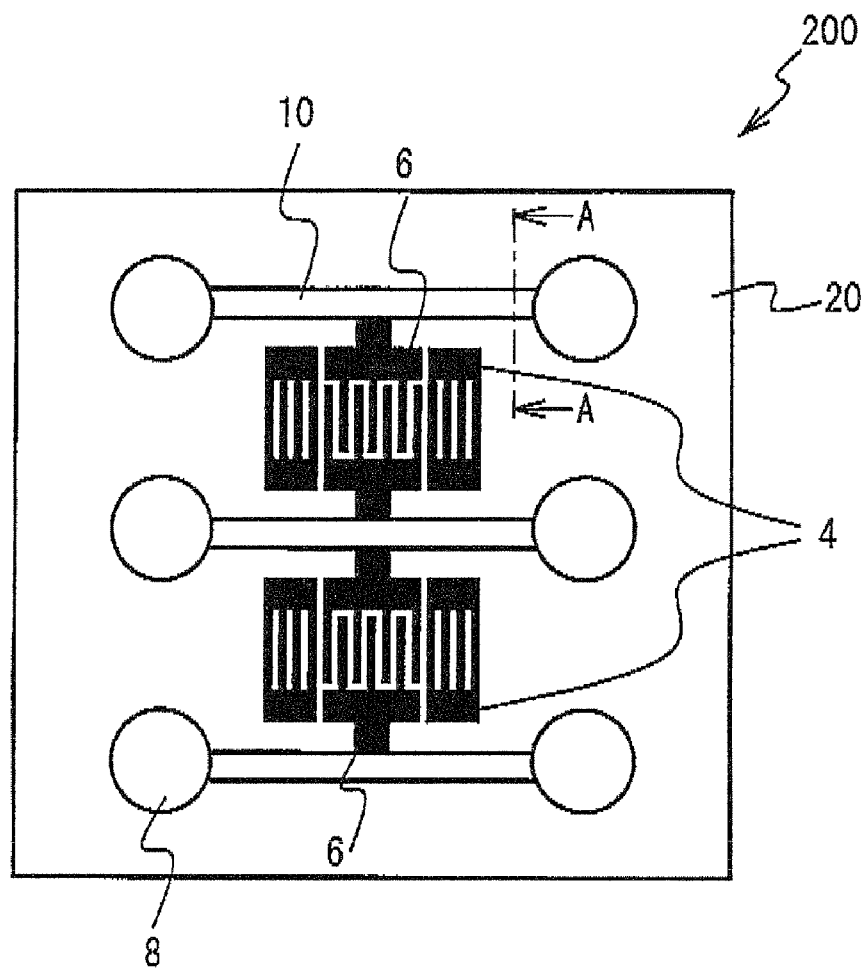
FIG. 3A is a plan view of a surface acoustic wave device in accordance with a first embodiment of the present invention.

FIG. 3A is a plan view of a SAW device 200 in accordance with a first embodiment. As illustrated in FIG. 3A, the SAW device 200, which may be a filter, has the piezoelectric substrate 2 of, for example, $LiNbO_3$ or $LiTaO_3$, on which the reflectors 4, the IDTs 6, the interconnections 10 and the external connection terminals 8 are provided. The conductive patterns on the piezoelectric substrate 2 may be made of Al or an alloy of Al—Cu. The inorganic insulation layer 20 is provided on the piezoelectric substrate 2 so that at least the external connection terminals 8 and the interconnection electrodes 12 are exposed, as will be described later. In FIG. 3, the reflectors 4 and the IDTs 6 are seen through the inorganic insulation layer 20.

Figure 3B:
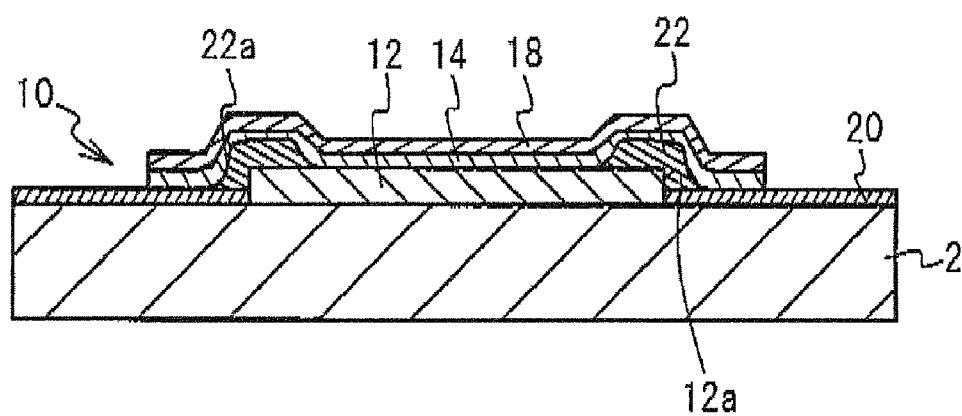
FIG. 3B is a cross-sectional view taken along a line A-A depicted in FIG. 3A.

FIG. 3B is a cross-sectional view taken along a line A-A in FIG. 3A. As illustrated in FIG. 3B, the interconnection electrode 12, which may, for example, be 350 nm thick, is provided on the piezoelectric substrate 2. The inorganic insulation layer 20, which may, for example, be 50 nm thick, is provided so that the interconnection electrode 12 can be exposed. An insulative resin layer 22 is provided on an interface between the interconnection electrode 12 exposed from the inorganic insulation layer 20 and the inorganic insulation layer 20 so as to cover the interface. The insulative resin layer 22 may, for example, be 1 μm thick and may be made of, for example, photosensitive resin such as photosensitive polyimide. The first metal layer 14, which may, for example, be 200 nm, is provided on the interconnection electrode 12 and the insulative resin layer 22. The third metal layer 18, which may, for example, be 150 nm, is provided on the first metal layer 14. An end of the insulative resin layer 22 is a forward tapered portion 22a.

The interconnection electrode 12 may be made of the same metal as the reflectors 4 and the IDTs 6 and may be made of, for example Al or an alloy of Al—Cu. The third metal layer 18 is made of a metal having a relatively low resistance and may be gold. The first metal layer 14 may be made of a metal having a good adhesiveness to Al for the interconnection electrode 12 and Au for the third metal layer 18, and may be titanium.

Figure 4:
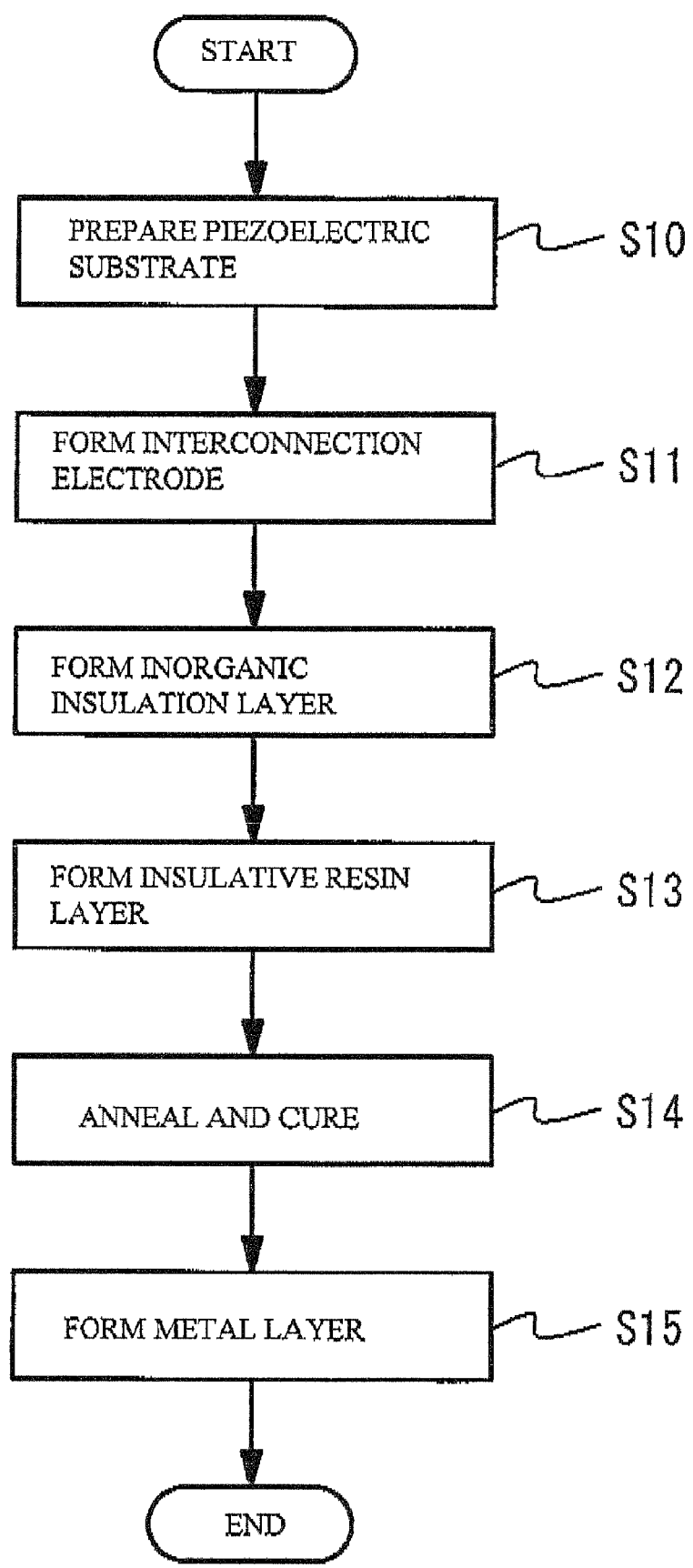
FIG. 4 is a flowchart of a method of fabricating the surface acoustic wave device illustrated in FIGS. 3A and 3B.

A description is now given of a method of fabricating the SAW device 200 in accordance with the first embodiment. FIG. 4 is a flowchart of the fabrication method, and FIGS. 5A through 6 are respectively cross-sectional views of the device in the fabrication method.

Figure 5A:
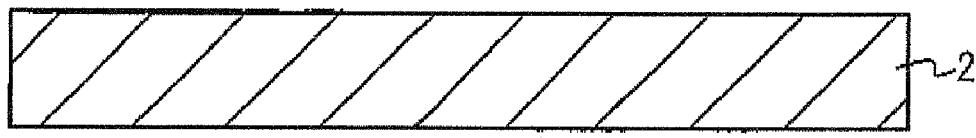
FIGS. 5A through 5D are cross-sectional views illustrating the method of fabricating the surface acoustic wave device illustrated in FIGS. 3A and 3B.
Figure 6:
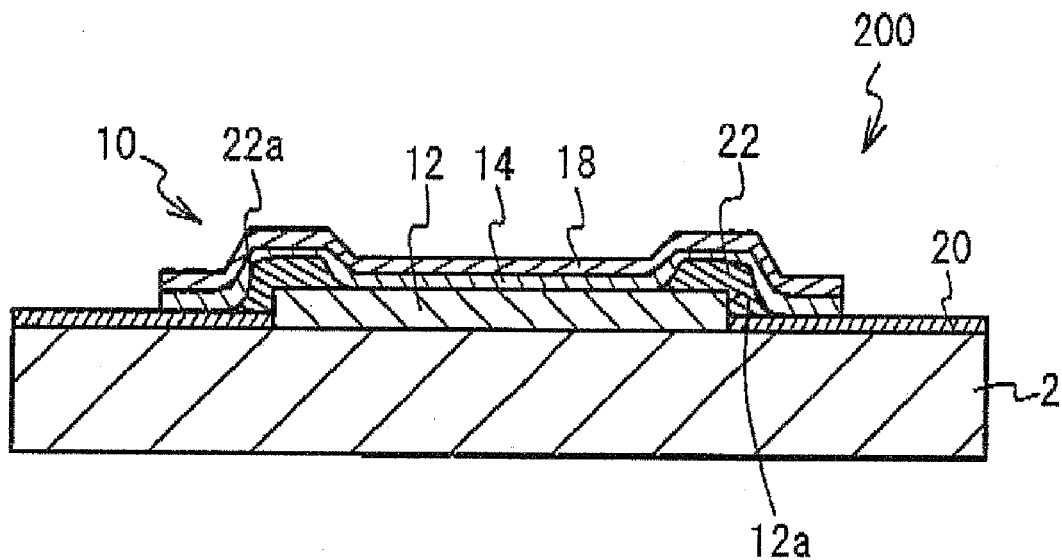
FIG. 6 is a cross-sectional view illustrating the method of fabricating the surface acoustic wave device illustrated in FIGS. 3A and 3B.

FIG. 5A is a cross-sectional view at step S10 depicted in FIG. 4 at which the piezoelectric substrate 2 is prepared.

Figure 5B:
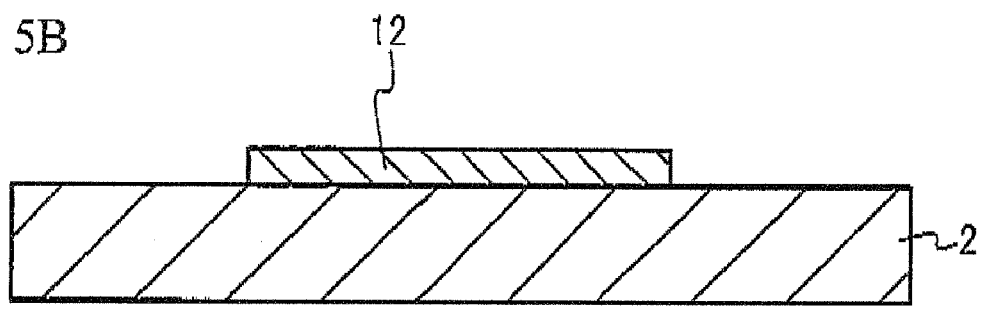

FIG. 5B is a cross-sectional view at step S11 at which an Al film or an Al—Cu alloy film is grown on the piezoelectric substrate 2 by sputtering. Then, the film is patterned into the reflectors 4, the IDTs 6, the external connection terminals 8 and the interconnection electrodes 12 by the photolithographic process. That is, the identical metal is used to form the reflectors 4, the IDTs 6, the external connection terminals 8 and the interconnection electrodes 12.

Figure 5C:
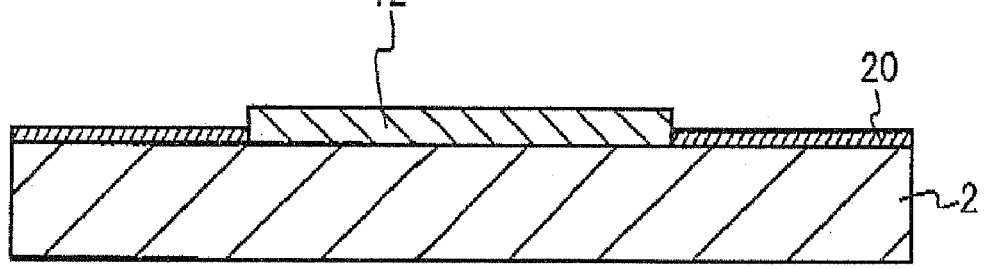

FIG. 5C is a cross-sectional view at step S12. At step S12, an $SiO_2$ film is grown on the piezoelectric substrate 2. Portions of the $SiO_2$ film located on the external connection terminals 8 and the interconnection electrodes 12 are removed by the photolithographic process. Thus, the inorganic insulation layer 20 is formed so that the external connection terminals 8 and the interconnection electrodes 12 can be exposed.

Figure 5D:
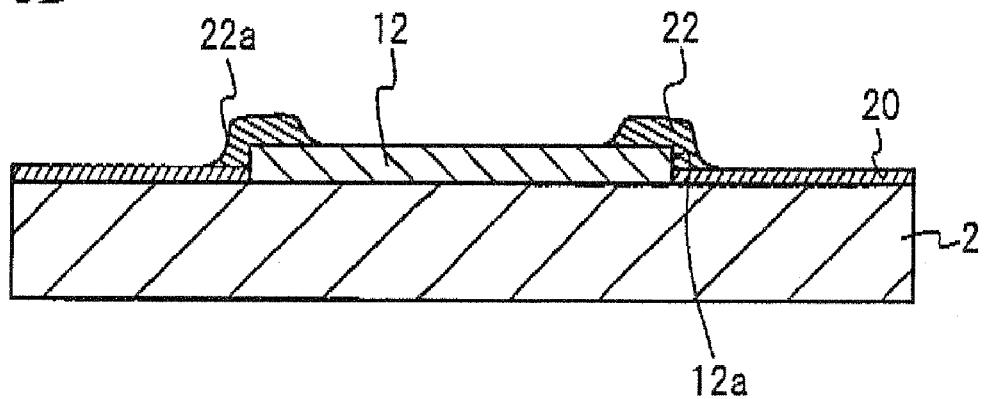

FIG. 5D is a cross-sectional view at steps S13 and S14. Referring to FIG. 5D, photosensitive polyimide resin is provided on the piezoelectric substrate 2 by spin coating. Then, the photosensitive polyimide resin is shaped by the photolithographic process, so that the insulative resin layer 22 is formed so as to cover the side surfaces 12a of the interconnection electrode 12 at the interfaces between the exposed interconnection electrode 12 and the inorganic insulation layer 20.

At step S14, the insulative resin layer 22 is annealed and cured. At this time, the piezoelectric substrate 2 is preferably heated from both the opposite sides, one of which has the IDTs 6 and the other has no IDTs 6. This process may use an oven. The end of the insulative resin layer 22 after heating is shaped into the forward tapered portion 22a.

FIG. 6 is a cross-sectional view at step S15. The first metal layer 14 is formed on the interconnection electrode 12 and the insulative resin layer 22 by evaporation and liftoff, and the third metal layer 18 is formed on the first metal layer 14 by evaporation and liftoff. Through the above-described steps, the SAW device 200 is completed.

According to the first embodiment, the insulative resin layer 22 covers the side surfaces 12a of the interconnection electrodes 12, so that the interconnection electrodes 12 can be protected. Further, the first metal layer 14 and the third metal layer 18 completely cover the interconnection electrodes 12 and the insulative resin layer 22. It is thus possible to increase the moisture resistance of the interconnections 10 and improve the reliability of the SAW device 200. Since the ends of the insulative resin layer 22 are the forward tapered portions 22a, the steps between the inorganic insulation layer 20 and the insulative resin layer 22 can be gentled. It is thus possible to prevent the insulative resin layer 22 from being thinned and to prevent a crack from occurring in the first metal layer 14 and/or the third metal layer 18. This improves the moisture resistance of the interconnections 10.

As has been described previously, the first metal layer 14 is made of a metal having good adhesiveness to the metal of the interconnection electrodes 12 and the metal of the third metal layer 18. The first metal layer 14 is sandwiched between the interconnection electrode 12 and the third metal layer 18, whereby the interconnections 10 can be strengthened and the reliability of the SAW device 200 can be improved. Further, the resistance of the interconnections 10 can be reduced because the third metal layer 18 can be formed of a metal having a relatively low resistance such as gold.

The inorganic insulation layer 20 may be made of a silicon compound such as silicon nitride (SiN) or silicon oxycarbide (SiOC) instead of $SiO_2$. The inorganic insulation layer 20 is required to be provided so that the external connection terminals 8 and the interconnection electrodes 12 can be exposed.

The insulative resin layer 22 is not limited to the photosensitive resin, especially, photosensitive polyimide. However, in practice, the insulative resin layer 22 is preferably photosensitive resin because the insulative resin layer 22 can be precisely formed by the photolithographic process at step S13. Further, it is preferable to use photosensitive resin because the forward tapered portions 22a can easily be formed by annealing at step S14.

The annealing process at step S14 may be carried out by heating one of the opposite surfaces of the piezoelectric substrate 2, one of which has the IDTs 6 and the other has no IDTs. In practice, it is preferable to heat the piezoelectric substrate 2 from both the opposite sides in order to precisely and efficiently form the ends of the insulative resin layer 22 into the forward tapered portions 22a.

Second Embodiment

Figure 7:
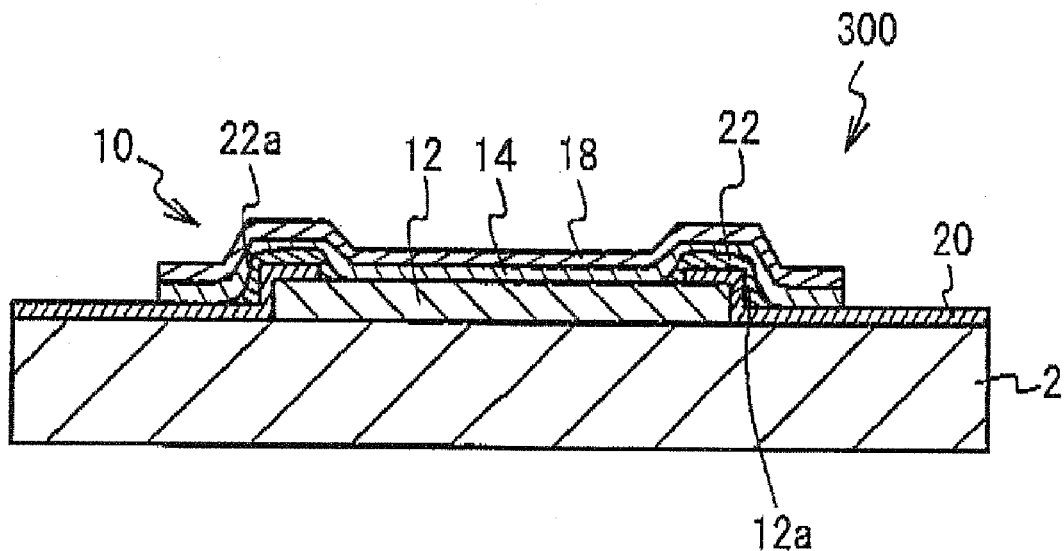
FIG. 7 is a cross-sectional view illustrating a method of a surface acoustic wave device in accordance with a second embodiment.

FIG. 7 is a cross-sectional view of a SAW device 300 in accordance with a second embodiment.

Referring to FIG. 7, the inorganic insulation layer 20 is formed so as to overlap the interconnection electrode 12. The insulative resin layer 22 is provided so as to be located on the interfaces between the interconnection electrode 12 and the inorganic insulation layer 20 so as to cover the side surfaces 12a of the interconnection electrode 12 across the inorganic insulation layer 20.

According to the second embodiment, the side surfaces 12a of the interconnection electrode 12 are covered with the inorganic insulation layer 20, so that the moisture resistance can further be improved and the reliability of the SAW device 300 can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A surface acoustic wave device comprising:
   a piezoelectric substrate;
   an interdigital transducer (IDT) formed on the piezoelectric substrate;
   an interconnection electrode that is provided on the piezoelectric substrate, is connected to the IDT, and is made of a metal identical to that of the IDT;
   an inorganic insulation layer that is provided on the piezoelectric substrate so that at least the interconnection electrode is exposed;
   an insulative resin layer that is located on an interface between the inorganic insulation layer and a portion of the interconnection electrode exposed from the inorganic insulation layer and is formed so as to cover a side surface of the interconnection electrode; and
   a metal layer that is provided on the interconnection electrode and the insulative resin layer.

2. The surface acoustic wave device according to claim 1, wherein the insulative resin layer has an end that has a forward tapered portion.

3. The surface acoustic wave device according to claim 1, wherein the inorganic insulation layer is provided so as to overlap the interconnection electrode.

4. The surface acoustic wave device according to claim 1, wherein the insulative resin layer includes photosensitive resin.

5. The surface acoustic wave device according to claim 1, wherein the insulative resin layer is photosensitive polyimide.

6. The surface acoustic wave device according to claim 1, wherein the IDT and the interconnection electrodes comprises Al or an alloy of Al—Cu.

7. The surface acoustic wave device according to claim 1, wherein the metal layer includes a titanium layer contacting the interconnection electrode, and a gold layer provided on the titanium layer.

8. A method of fabricating a surface acoustic wave device comprising:
   forming an interdigital transducer (IDT) and an interconnection electrode connected thereto on a piezoelectric substrate, the IDT and the interconnection electrode being made of an identical metal;
   forming an inorganic insulation layer on the piezoelectric substrate so that at least the interconnection electrode is exposed;
   forming an insulative resin layer on an interface between the inorganic insulation layer and a part of the interconnection electrode exposed from the inorganic insulation layer; and
   forming a metal layer on the interconnection electrode and the insulative resin layer.

9. The method according to claim 8, wherein forming the insulative resin layer includes forming the insulative resin layer so as to forwardly taper an end of the insulative resin layer.

10. The method according to claim 8, wherein forming the inorganic insulation layer includes forming the inorganic insulation layer so that the inorganic insulation layer overlaps the interconnection electrode.

11. The method according to claim 8, wherein forming the insulative resin layer includes shaping photosensitive resin by a photolithographic process, and annealing the photosensitive resin.

12. The method according to claim 11, wherein annealing the photosensitive resin applies heat to opposite surfaces of the piezoelectric substrate, one of which has the IDT.

* * * * *